Inventors:
Andrew P. Boehmer and
Boubene M. Jaremus
By: James J. Jennings, Jr. Atty.

Inventors
Andrew P. Boehmer and
Boubene M. Jaremus
By: James J. Jennings, Jr. Atty.

Inventors:
Andrew P. Boehmer and
Boubene M. Jaremus
By: James J. Jennings, Jr. Atty.

United States Patent Office 3,451,904

Patented June 24, 1969

3,451,904

METHOD OF MAKING A THERMOELECTRIC ASSEMBLY COMPRISING ANODIZING AND IMPREGNATING AND COATING WITH DIMETHYL SILICONE FLUIDS

Andrew P. Boehmer, Des Plaines, and Boubene M. Jaremus, Barrington, Ill., assignors to Borg-Warner Corporation, a corporation of Illinois Original application Jan. 30, 1962, Ser. No. 169,805, now Patent No. 3,332,807, dated July 25, 1967. Divided and this application Sept. 22, 1966, Ser. No. 606,475

Int. Cl. H01v *1/28;* C23f *17/00*

U.S. Cl. 204—38 1 Claim

This application is a division of application Ser. No. 169,805, filed Jan. 30, 1962 entitled "Thermoelectric Refrigerator," now Patent No. 3,332,807, and assigned to the assignee of this invention.

This invention relates to processes for making thermoelectric assemblies and more particularly to such processes applicable to refrigeration, heat pumps, and the like.

Thermoelectric assemblies are known to employ the Peltier phenomenon of heat absorption and heat dissipation at a current carrying junction between two dissimilar metals having thermoelectric properties to produce a cooling or heating effect, dependent upon the direction of flow of the current. In an application, such as a refrigerator, one of two junctions of the thermoelectric assembly is positioned within an insulated chamber and a direct electric current is passed through the junction in such a direction that the junction becomes cooler while the other of the two junctions of the thermoelecric device is disposed externally of the chamber and dissipates heat to a suitable heat sink such as cooling water or air, or the like.

Thermocouple assemblies usually include a plurality of pairs of dissimilar thermoelectric elements or modules connected in electrical series by sets of connecting junctions, with the cold junctions being located in one set and the hot junctions located in another set and with the two sets spaced apart. When the direct current flows in one direction, the junctions of one set of junctions operate as cold junctions and the junctions of the remaining set of junctions operate as hot junctions.

In particular, the thermoelectric module assembly employs a series of alternate P-type elements and N-type elements embedded in thermal and electrical insulation of foamed plastic, such as foamed polyurethane, or the like. The P and N elements are connected in electrical series and to a source of direct current. All of the junctions connecting an N element to a P element are located on one side of the assembly, and all of the junctions connecting a P elemet to an N element are located on the other and opposite side of the assembly.

One side of the module assembly thereby manifests the accumulative effect of all the cold junctions and is therefore effective to absorb heat from the atmosphere or from a metal or other plate or block having good thermal conducting properties and which is positioned, for example, in a refrigerator cooling compartment. Similarly, the other side of the module assembly manifests the accumulative effect of all the hot junctions and is thereby effective to dissipate the heat to the atmosphere or through a metal or other plate having good thermal conducting properties and which may be provided with heat dissipating cooling fins disposed in a heat sink of cooling air, water, or the like.

Aluminum and copper are the metals usually employed for efficient thermoconductive plates to provide heat conduction into and away from the modules. However, these metals also have a good electrical conductive capacity, which is an undesirable feature in view of the ability of such metals to short-circuit the flow of the direct thermoelectric current from one module to another. It is known that one or the other or both surfaces of the adjacent faces of the modules and heat transfer plates may be anodized or otherwise insulated from each other by quartz and epoxy resin. Plastic material such as polyester film may also be interposed between the heat transfer plates to electrically insulate the modules from the plates. However, such electric insulating materials are highly unsatisfactory inasmuch as they have poor thermoconductive qualities.

Further, it has also been found that the irregular character of an anodized surface will prevent it from standing up in service. For example, where the anodized surfaces are subjected to moisture and are under the flow of direct current as in refrigeration applications, the surfaces will electrolyze and puncture. This puncture permits flow of current into the plate and thereby short-circuits the modules with the plate, causing current to flow between the modules and negating the desired thermoelectric effect. It is, therefore, highly desirable to provide a barrier for electrically insulating the module assemblies but which will provide thermoconductivity so as to allow the unidirectional heat transfer through the module assembly by the heat absorption and heat dissipation abilities thereof.

An object of the present invention is to provide a new and improved process for making a thermoelectric assembly in which the cold and hot junction of the modules and the heat-absorbing and heat-dissipating masses are provided with means effective to provide good thermoconductivity while preventing electrical conductivity between the junctions and the plates.

A specific object of this invention is to provide a new and improved process for making a thermoelectric assembly in which aluminum or copper thermoconductive members have anodized surfaces which have a dimethyl silicone dielectric fluid imposed thereon. The imposed fluid may be provided by either impregnating the anodized surface or applying a highly viscous dielectric silicone or similar fluid over the impregnated anodized surface or by both impregnating and applying such a fluid. The impregnating fluid enters the pores and interstices of the anodized surfaces to provide a permanent thermoconducting dielectric seal, and the viscous dielectric fluid further improves the dielectric and thermoconducting qualities of the surface in a novel manner significantly better than any manner previously known.

With these and other objects in view, the present invention comprises the process of making a thermoelectric wherein the assembly has thermoelectric material for pumping or otherwise transporting heat, and thermoconductive shims for electrically insulating the assemblies. The shims have a thermoconductive and electrical non-conductive surface provided by a process wherein a surface of the metal shims is anodized to provide a dielectric barrier. The anodized surface is impregnated and sealed with a dielectric fluid and may have a grease-like dielectric fluid applied thereto in lieu of the impregnation or in combination therewith to increase thermoconductivity, to improve the dielectric properties of the anodized surface, and to withstand electrolytic action during use in a moist atmosphere.

Other objects, advantages and novel aspects of the invention will become apparent upon consideration of the following detailed description in conjunction with the accompanying drawings wherein.

Figure 1:
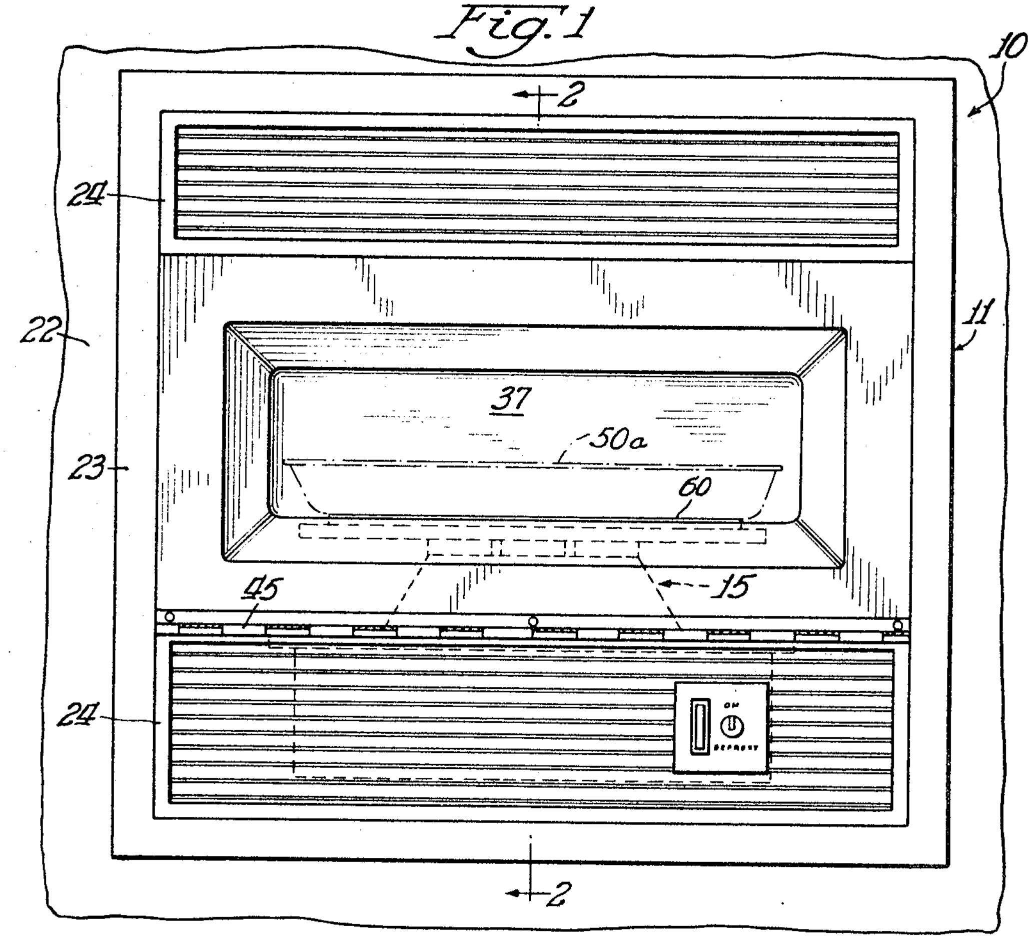
FIG. 1 is a front view of a thermoelectric refrigerator with the door removed.
Figure 7:
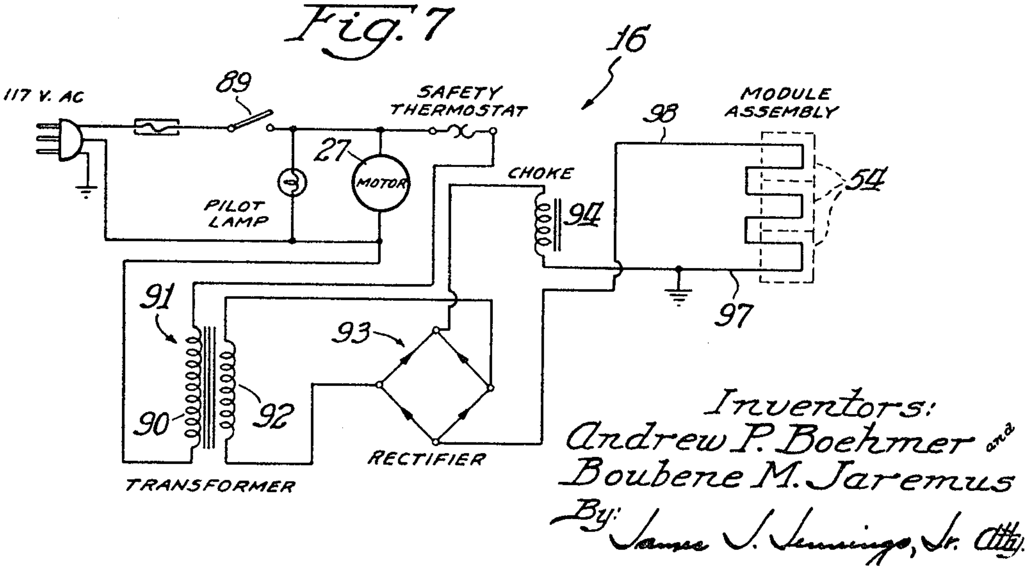
FIG. 7 is a schematic diagram of the electric circuitry for the thermoelectric refrigerator.
Figures 2, 8, 9:
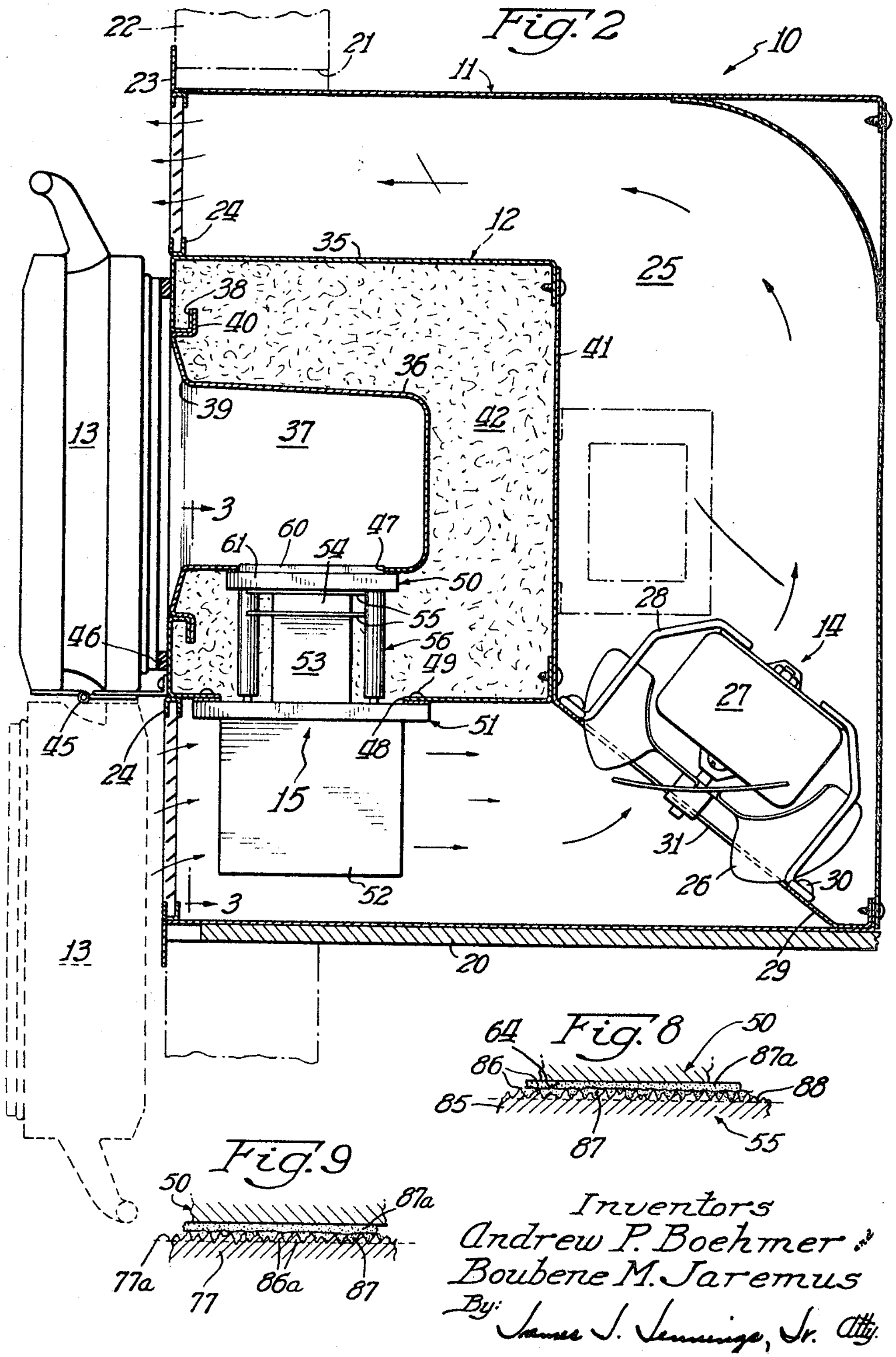
FIG. 2 is a sectional view taken along line 2—2 of FIG. 1 showing the relative position of the main elements of the thermoelectric refrigerator.
FIG. 8 is an enlarged partial cross sectional view of the novel shims showing the general configuration of the material thereof.
FIG. 9 is an enlarged partial cross sectional view of an anodized terminal plate illustrating a variation of the invention.

Referring to the drawings, there is illustrated in FIGS. 1 and 2 a thermoelectric refrigerator generally designated by the numeral 10. This thermoelectric refrigerator consists generally of an outer cabinet 11, a refrigerator cabinet 12, a refrigerator cabinet door 13, a fan 14, a thermoelectric refrigeration unit 15, and an electric power system 16 (FIG. 7).

The outer cabinet 11 is supported on a support member 20 within an opening 21 in a wall 22 and is provided with a flange 23 to enclose the opening 21. The refrigeration cabinet 12 is suspended within the outer cabinet 11 on upper and lower louvered brackets 24 so as to provide a U-shaped air duct 25 on three sides of the refrigerator cabinet 12. The fan 14 has a blade 26 driven by a motor 27 mounted on a support bracket 28. The bracket 28 is secured to a refrigerator support 29 by rivets or other similar means 30. The support 29 is provided with an aperture 31 and the fan 14 is adapted to draw air through the lower louvered bracket 24, duct 25 and the aperture 31, and out through the upper louvered bracket 24 as indicated by the arrows (FIG. 2).

The refrigeration cabinet 12 is provided with an outer shell 35, an inner shell 36 and a refrigeration compartment 37 defined by the inner shell 36. The outer shell 35 has an inwardly extending flange 38 which defines a front opening 39 of the refrigeration compartment 37. The compartment 37 has an outwardly extending flange 40 in complementary engagement with flange 38 for sealing the outer shell 35 and the refrigeration compartment 37.

The refrigeration compartment shell 35 has a removable back panel 41 and thermal insulation material 42 is provided between the inner compartment shell 36 and the outer shell 35. The door 13 is pivotally mounted on a hinge 45 secured to the outer shell 35 and is provided with a gasket 46 adapted to seal the front opening 39 of the refrigeration compartment 37 when the door 13 is in the raised position (FIG. 2). The door may be held in the raised position by a magnet or other known type of latch means (not shown).

The thermoelectric refrigeration unit, generally designated by the numeral 15, is supported in apertures 47 and 48 of the inner and outer shells 36 and 35 respectively by screws 49. The thermoelectric unit 15 includes generally a freezing plate 50, having an ice cube tray or other body **50*a* to be cooled, a heat conducting plate 51 having fins 52, a heat transfer block 53, thermoelectric modules 54, dielectric thermoconductive shims 55 and an electrical and thermal insulating screw assembly 56**.

The freezing plate 50 has an upper portion 60 positioned in the aperture 47 of the inner compartment shell 36, and a lower surface portion 61 positioned adjacent the aperture 47. A gasket 62 is provided for thermally sealing the refrigeration compartment 37 and the freezing plate 50.

The heat conducting plate 51 has the fins 52 thereof secured in slots 63 and positioned in the duct 25 in the path of the incoming air circulated through the duct 25. The fins 52 are thus capable of readily dissipating heat to the air passing there around in the duct 25. The heat transfer block 53 is secured to the heat conducting plate 51 and supports the modules 54 between the novel shims 55 which are respectively held in engagement with a bottom surface 64 of the freezing plate 50 and the upper surface **53*a* of the heat transfer block 53**.

Figure 3:
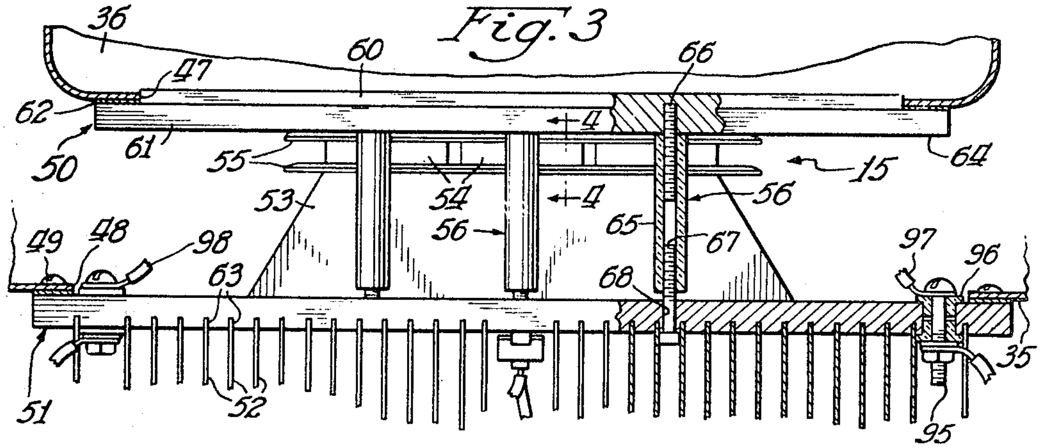
FIG. 3 is a partially sectioned view taken along line 3—3 of FIG. 2 showing the thermoelectric unit in position in the refrigerator.

The elements of the thermoelectric unit 15 are held in this stacked relationship (FIGS. 2 and 3) by the screw assembly 56. The assembly 56 includes a dielectric and non-thermal conductive threaded sleeve 65, a stud screw 66 threaded into the freezing plate 50 and the sleeve 56, and a screw 67 inserted through a passage 68 in the heat conducting plate 51 between the fins 52 and threaded into the threaded sleeve 65.

The modules 54 (FIGS. 4 and 5) include generally lower terminal conductor strips 75, lower conductor strips 76, upper conductor strips 77, dissimilar thermoelectric elements 78, and a dielectric and thermal nonconductive material 79.

Figures 4, 5, 6:
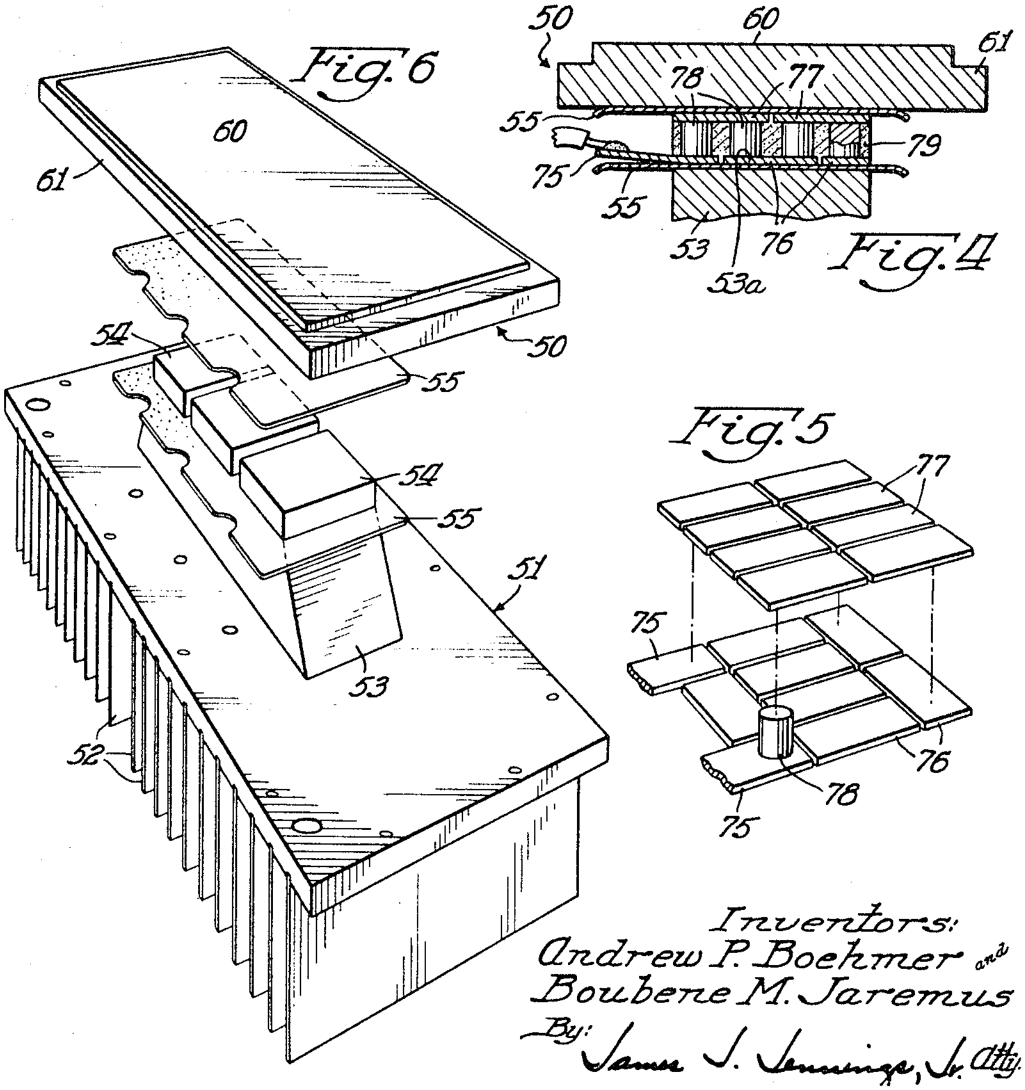
FIG. 4 is a sectional view of the thermoelectric modules taken along line 4—4 of FIG. 3 showing the novel dielectric and thermoconductive shims in position.
FIG. 5 is an expanded isometric view of the thermoelectric module assembly showing the relative position of the conductor strips and the interposed modules.
FIG. 6 is an expanded isometric view of the complete thermoelectric unit showing the relative positions of the thermoelectric module assembly, novel dielectric thermoconductive shims, freezing plate, and the heat conducting blocks.

The terminal strips 75, lower conductor strips 76, and the upper conductor strips 77 may be arranged as indicated in FIG. 5 so that the dissimilar thermoelectric elements 78, illustrated as cylindrical, are alternately positioned between the upper conductor strips 77 and the lower conductor and terminal strips 76 and 75 respectively. The elements 78 are respectively soldered to the upper strips 77 and the lower strips 75 and 76 to provide a cold junction with the upper strips 77 and a hot junction with the lower strips 75 and 76. These solder connections with the respective strips also serve to serially interconnect the dissimilar thermoelectric elements 78. The thermoelectric module elements 78 are further supported in position between the upper strips 77 and the lower strips 75 and 76 by the dielectric and thermal nonconducting material 79. The material 79 may be a polyurethane plastic or other similar material which may be foamed or otherwise formed around the elements 78 for the further lateral support of the thermoelectric elements 78 (FIG. 4).

The terminal strips 75 are connected to a source of direct current (henceforth described) which has a direction such that the upper conductor strips will act as heat absorbing strips and the lower conductor strips 76 will act as heat dissipating strips. Thus, the upper strips 77 are considered to manifest a collective cold effect of a cold thermoelectric junction and similarly the lower strips 75 and 76 manifest a collective hot effect of a hot thermoelectric junction.

The shims 55 are positioned above and below the modules 54 (FIG. 4) to electrically insulate adjacent strips, the upper strips 77 from the freezing plate 50 and the lower strips 75 and 76 from the heat transfer block 53 respectively. The shims 55 also provide thermal conductivity between the cold heat absorbing strips 77 and the freezing plate 50, and between the heat dissipating strips 76 and the heat transfer block 53.

The novel shims 55 include generally a metal plate or base 85 (FIG. 8), an anodized layer 86, a dielectric thermoconducting fluid 87, which has a low viscosity, and a highly viscous dielectric and thermoconducting fluid **87*a*. The base 85 is in the form of a metal plate of electrically and thermoconductive material such as aluminum and is provided with the hard anodized layer 86 by anodizing the upper surface 88 of the late 85 to provide a dielectric layer on the metal base plate 85**.

The anodizing of the aluminum surface may be provided by suspending the aluminum plates 85 beneath the surface of diluted sulphuric acid bath and imposing a 50 to 75 watt current between the aluminum plates and the acid bath which causes aluminum oxide 86 to grow or otherwise form itself on the surface 88 of the aluminum plate 85. The current is applied for 15 to 20 minutes to form a .002 inch thick film of anodize. The sulphuric acid should be maintained at 28° F. and after the anodizing is complete, the parts are given a cold water rinse followed by a hot water rinse. The hot water tends to seal any unoxidized aluminum at the base of the aluminum oxide growth structure 86.

The oxidized dielectric layer 86 was found to be an irregular growth surface which made it susceptible to electrolysis when subjected to moisture and an electric current as is the case in the present refrigeration application thereof and ultimately results in a breakdown and puncture of the anodized layer. The breakdown of the dielectric quality of the layer 86 results in a detrimental effect on the necessary dielectric characteristic thereof. In an effort to prevent this and to improve the thermoconducting dielectric qualities of the anodized layer 86, the dielectric anodized surface 86 has a dielectric fluid imposed thereon. The fluid may be imposed by either impregnating the anodized surface 86 with a dielectric fluid 87 or applying a highly viscous dielectric fluid **87*a* thereover or by both impregnating and applying fluid 87 and 87A** respectively.

The fluid 87 is caused to enter the interstices of the anodized surface 86 by the impregnation thereof to prevent breakdown and puncture of the surface layer 86 due to the electrolytic action caused by the coaction of moisture and direct current to which the anodized surface 86 is subjected. The highly viscous fluid **87*a* is merely applied to the anodized surface layer 86**.

The anodized base plates 85 are impregnated with the dielectric thermoconducting fluid 87 such as silicone dimethyl silicone or a silicone filled fluid by first submerging the anodized aluminum plates 85 in a tank of the low viscous fluid. The tank and the contents thereof are placed in a vacuum chamber. The pressure in the vacuum is lowered to approximately 29½ inches Hg and is held at this pressure until the air in the anodized aluminum layer 86 and in the fluid 87 is removed. The air is usually fully removed when the bubbling of the fluid 87 ceases.

The vacuum is thereupon released and the air pressure thus exerted on the surface of the fluid 87 forces the fluid into the interstices of the anodized growth 86 on the base plates 85 and thus seals the anodized surface 86 against puncture brought about by the coaction of moisture and direct current that is to be imposed on the shims 55. This thorough sealing of the anodized layer 86 improves the dielectric qualities of the surface of the shims 55 as well as increasing the thermal conduction qualities thereof.

Although the impregnation fluid 87 greatly improves the thermoconductivity of the anodized surface 88 as well as protecting this surface, the thermoconductivity can be further improved by applying the highly viscous dielectric and thermoconducting fluid **87*a* to the impregnated anodized surface 88. This highly viscous dielectric fluid 87*a* may be silicone dimethyl silicone or a grease-like silicone filled fluid. The highly viscous fluid 87*a* greatly increases the surface contact area of the anodized surface 88 and provides a continuous thermoconducting material between the impregnated anodized surface layer 86 and the plates 50 and 51**.

An electric system which may be utilized for the actuation of the thermoelectric refrigerator is schematically illustrated in FIG. 7. A 117 volt AC current source supplies current through a switch 89 to the fan motor 27 which drives the fan 26 in the duct 25 and to a primary coil 90 of the transformer 91. A secondary coil 92 of the transformer 91 provides a 5 or 6 volt AC current which is applied to a rectifier system 93.

The rectifier system 93 rectifies the secondary coil alternating current and thereby provides a direct current which is filtered through a choke 94 and thereupon applied to terminal screws 95 (FIG. 3) secured to the heat conducting plate. The terminal screws 95 are insulated from the plate 51 by flanged eyelets 96. The direct current is thereupon conducted to the thermal conductor strips 75 (FIG. 4) of the rightmost module 54 (FIG. 3) by an insulated conductor 97 and thereupon passes serially through each of the modules 54 and between adjacent terminal conductor strips 75 of each module 54 and is returned to the rectifier system 93 through the leftmost terminal strip 75 and an insulated conductor 98.

In operation, the thermoelectric refrigerator is actuated by closing the switch 89 (FIG. 7) to apply the 117 volt alternating current to the motor 27 and to the transformer 91. The motor will drive the fan blade 26 causing air to flow through the duct 25 between the louvered brackets 24. Simultaneously, the transformer will reduce the voltage to 5 or 6 volts which is supplied to the rectifier system 93. The rectifier 93 rectifies the current into a pulsating DC current.

This rectified current is applied to the choke 94 to filter the pulsating direct current to provide a smoother direct current which is applied to the rightmost terminal strip 75 through the insulated conductors 97 and the terminal 95. The alternate dissimilar relationship between the elements 78 and the series connection therebetween thereupon causes the upper terminal strips 77 to be heat collectors and likewise causes the lower conductor strips 76 to become heat dissipators.

The shims 55 are respectively provided above and below the modules 54 between the freezing plate 50 and the modules 54 and the heat transfer block 53 respectively. Inasmuch as the freezing plate 50, upper shim 55, modules 54, lower shim 55, and heat transfer block 53 are all held in direct engagement by virtue of the screw assemblies 56, the hot and cold collecting strips 75 and 76 and 77 of the modules 54 in conjunction with the thermoconductivity of the modules themselves will be effective on the freezing plate 50 and the heat transfer block 53 to conduct heat from the freezing plate 50 to the modules 54 into the heat transfer block 53.

Heat will thereby be pumped from the ice cube tray **50*a*, or other body in contact with the plate 50, which is to be cooled, and will be dissipated into the heat transfer block 53. The heat transfer block 53 will transfer the heat to the heat conductor block 51 which in turn will transfer the heat to the fins 52 positioned in the duct 25. The air circulated in the duct 25 by the fan 14 will cause the fins to dissipate the heat thus transferred thereto into the duct air. The heated air will thereupon be removed from the duct 25 through the upper louvered support brackets 24**.

Thus it is seen that the modules 54 will cause the heat in the ice cube tray **50*a* to be pumped or otherwise conducted through the thermoelectric unit 15 and expelled via the duct 25. In particular, the heat will be transmitted through the freezing plate 50, the upper shim 55, the modules 54, the lower shim 55, the heat conducting block 53 and through the fins 52 into the air stream of the duct 25. It should be noted that an attempt might be made to transfer heat through modules having either a plastic or similar dielectric material, or a metallic thermoconductive barrier of the known types, in lieu of the shims 55 which are both highly thermoconductive for heat transfer and dielectric for preventing short-circuiting of the module components. However, such attempts to transmit heat through the modules 54 would be resisted by a dielectric low thermal conducting barrier, or would be short-circuited by a highly thermoconductive and electrically conductive barrier, which is not presented by the shims 55**.

It should be noted (FIG. 9) that the terminal strips 75, 76, and 77 could have the outer surfaces **77*a* anodized in the manner above described so as to provide an anodized coating 86*a* directly on the terminal strips and that the low viscous fluid 87 and the highly viscous fluid 87*a* can be applied thereto in the manner above described. This would provide the terminal strips 75, 76 and 77 with a dielectric thermoconductive boundary comprising the anodized material 86*a*, the silicone or other low viscosity dielectric fluid 87 impregnated in the anodized material 86***a*, and the high viscosity dielectric fluid 87*a* in lieu of the shims 55 or in combination therewith.

Similarly, it should be noted that the lower surface 64 of the freezing plate 50 and the upper surface of the heat transfer block 53 could likewise be anodized, impregnated with the low viscous dielectric fluid 87, and the highly viscous fluid 87*a* applied thereto to provide the dielectric and thermoconductive boundary above described. The freezing plate and heat transfer plate boundaries thus provided could be utilized together or independently in lieu of or in combination with the respective shim or terminal strip boundaries as above described.

We wish it to be understood that the invention is not to be limited to the specific constructions and arrangements shown and described, except only insofar as the claims may be so limited, as it will be understood to those skilled in the art that changes may be made without departing from the principles of the invention.

What is claimed is:

1. The method of making a thermoelectric assembly comprising the steps of providing a metal plate which is both electrically conductive and thermally conductive, submerging the metal plate in a dilute sulphuric acid solution, maintaining the acid solution at a predetermined temperature, applying a direct current voltage between the plate and the acid solution for oxidizing the surface of said plate to provide an anodized surface thereon, removing the plate from the acid solution, rinsing the plate, submerging the plate in a dimethyl silicone fluid, placing the silicone fluid and the submerged plate in a vacuum chamber, reducing the air pressure in said chamber, then allowing atmospheric air to enter said chamber to increase the air pressure on the surface of said silicone fluid and force the fluid into the interstices of the anodized surface of the metal plate to seal the anodized surface, applying a highly viscous dimethyl silicone fluid coating to the already-impregnated anodized surface to improve the thermally conductive and dielectric properties of the anodized surface, and operatively attaching said impregnated and coated metal plate to thermoelectric elements to produce a thermoelectric assembly.

References Cited

UNITED STATES PATENTS

| | | | |
|---|---|---|---|
| 2,163,213 | 6/1939 | Springer | 204—37 |
| 2,364,713 | 12/1944 | Hensel | 204—37 |
| 2,428,608 | 10/1947 | Bass | 174—35 |
| 2,452,254 | 10/1948 | McGregor | 260—448.2 |
| 2,537,433 | 1/1951 | Waring | 204—38 |
| 2,683,113 | 7/1954 | Prance et al. | 204—58 |
| 3,075,030 | 1/1963 | Elm et al. | 136—208 |
| 3,075,360 | 1/1963 | Elfing et al. | 136—204 |
| 3,100,969 | 8/1963 | Elfing | 62—3 |
| 3,235,476 | 2/1966 | Boyd et al. | 117—213 |

FOREIGN PATENTS

| | | |
|---|---|---|
| 679,559 | 9/1952 | Great Britain. |
| 817,077 | 7/1959 | Great Britain. |
| 1,247,882 | 10/1960 | France. |
| 1,269,350 | 7/1961 | France. |

OTHER REFERENCES

Dow Corning Corp Silicone Notebook Fluid Series No. 3. Issued September 1948. Copy in Scientific Library.

JOHN H. MACK, *Primary Examiner.*

A. BEKELMAN, *Assistant Examiner.*

U.S. Cl. X.R.

136—201, 203; 29—573